United States Patent [19]
Sahota

[11] Patent Number: 5,923,993
[45] Date of Patent: Jul. 13, 1999

[54] METHOD FOR FABRICATING DISHING FREE SHALLOW ISOLATION TRENCHES

[75] Inventor: Kashmir S. Sahota, Fremont, Calif.

[73] Assignee: Advanced Micro Devices, Sunnyvale, Calif.

[21] Appl. No.: 08/982,230

[22] Filed: Dec. 17, 1997

[51] Int. Cl.⁶ .................................................. H01L 21/76
[52] U.S. Cl. ......................... 438/427; 438/424; 438/435; 438/692; 148/DIG. 50
[58] Field of Search .................................. 438/424, 427, 438/435, 692; 148/DIG. 50

[56] References Cited

U.S. PATENT DOCUMENTS

| 5,498,565 | 3/1996 | Gocho et al. | 148/DIG. 50 |
| 5,665,202 | 9/1997 | Subramanian et al. | 438/692 |
| 5,721,173 | 2/1998 | Yano et al. | 438/424 |
| 5,728,621 | 3/1998 | Zheng et al. | 438/427 |

OTHER PUBLICATIONS

Boyd, John M., "A One–Step Shallow Trench Global Planarization Process Using Chemical Mechanical Polishing," Journal of the Electrochemical Society, vol. 144 No. 5, p. 1838, May 1997.

*Primary Examiner*—Trung Dang
*Attorney, Agent, or Firm*—LaRiviere, Grubman & Payne, LLP

[57] ABSTRACT

A fabrication process for manufacturing integrated circuits with isolation trenches. The process includes the use of two nitride layers and an oxide layer formed by high density plasma oxidation, to provide isolation trenches free of dishing. The isolated regions are useable for fabrication microelectronic circuit devices, such as MOS transistors or flash memory devices.

16 Claims, 6 Drawing Sheets

METHOD FOR FABRICATING DISHING FREE SHALLOW ISOLATION TRENCHES

TECHNICAL FIELD

The present invention relates to fabrication processes used in the manufacture of integrated circuit isolation trenches. More particularly, the Applicant's invention relates to an improved method for the chemical mechanical polishing ("CMP") of surfaces of microprocessors such that wide isolation trenches do not exhibit the dishing phenomenon caused by the prior art methods.

BACKGROUND OF THE INVENTION

Integrated circuits have used films of silicon dioxide and silicon nitride as insulating or dielectric layers to electrically isolate independent circuit components. Typical isolation schemes use dielectric isolation whereby trenches in a substrate layer are formed for receiving electrically isolating materials (oxides, polysilicon, etc.). After processing, the trenches electrically separate the microelectronic components constructed on either side of the isolation trench. The present invention is an improved method for isolation trench construction.

Microelectronic circuits, in the form of integrated circuits, are constructed in a multitude of process steps. Among the most crucial steps are the patterning process steps by which circuit patterns are permanently transferred onto the surface layers of semiconductor wafers. In order to accurately transfer a pattern, the wafer surface must be planar.

Wafer surface flatness is a critical requirement for small dimension patterning. A key element of patterning involves the projection of patterns onto the wafer's surface. This extremely delicate process involves the excruciatingly precise projection of the required patterns onto the wafer's surface in a uniform manner. If the surface is not flat, the projected image will be distorted, just as film images are out of focus on a non-flat screen. These distortions cause a number of undesirable effects. Wafer surface variation causes depth of field problems which cannot always be rectified, leading to increased incidence of wafer failure. Furthermore, as the wafer's circuits are layered upon one another, surface planarity defects are magnified. This effect greatly reduces process yield and is therefore highly undesirable.

Planarization of the wafer's surface is generally accomplished through CMP. CMP is effective in solving many surface uniformity problems. Unfortunately, prior art CMP techniques require many steps, are time consuming, and do not entirely solve the problem of surface uniformity.

The present invention solves many of these problems. The method eliminates excess masking and etching steps from the isolation trench formation process. The prior art dishing problems present in wide trenches are substantially reduced by the present invention. In short, the present invention improves efficiency, reduces manufacturing costs, simplifies manufacture, and reduces the overall process time. Critically, the invention achieves a more planar surface, and reduces significantly the dishing problems present in wide trenches that are common to all prior art CMP methods. The overall effect of the present invention is greater efficiency at reduced cost.

The Applicant's invention is most easily understood in view of the process techniques which currently exist in the art (FIG. 1). Prior art processes begin with ordinary silicon crystal wafers (which may be doped or not) (101). These are thermally oxidized to create a silicon dioxide layer (102), approximately 200–400 Å deep ("d"). A layer of nitride is then deposited on the wafer in a thickness of between about 1,000–about 2,000 Å (103). Commonly the layer of silicon nitride ($Si_3N_4$) is approximately 1,700 Å deep (103). This is the basic starting wafer.

The wafer is then masked with photoresist pattern (201) as shown in FIG. 2. A first etch is used to remove the nitride and oxide layers down to the silicon wafer surface, as in FIG. 3. A second etch step is used to remove the silicon surface area through the openings in the mask, creating trenches (301) as shown in FIG. 4.

FIG. 5 shows the silicon dioxide deposition layer (501) on the etched wafer of FIG. 4. Typical deposition is done using PETEOS or LPCVD techniques, but may be accomplished by any other silicon dioxide deposition methods. The wafer is then reverse masked with photoresist (601) as shown in FIG. 6. The wafer is etched a third time, leaving an irregular oxide profile (501A) after the photoresist is removed, as shown in FIG. 7. CMP is then used to grind and planarize the surface. The grinding continues until the surface is at least 100 Å into the nitride layer, as shown in FIG. 8. This causes the depressions present in the trenches (8a, 8b, 8c). The effects are particularly pronounced in wide trenches (8c). A slight bowing of the pads used in the CMP process causes the lower surface areas (i.e. the isolation trenches) to be unintentionally ground down. This phenomenon is known as "dishing," and is undesirable for the reasons set forth above.

DISCLOSURE OF THE INVENTION

Figure 9:
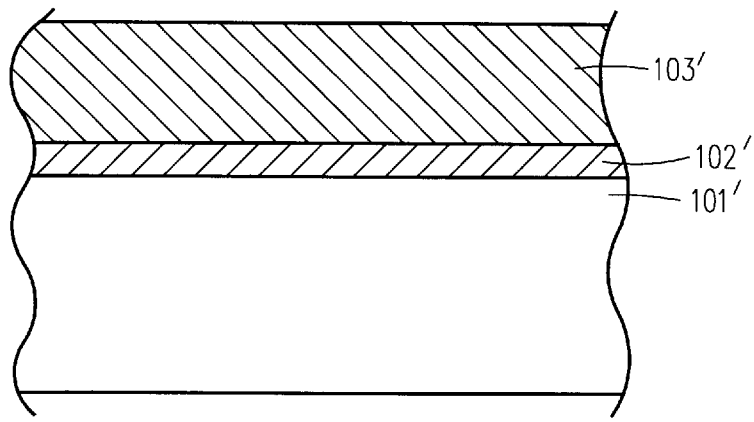
FIG. 9. Wafer of the invention showing the oxide layer and the base nitride layer over the semiconductor substrate.

The Applicant's invention neatly dispenses with the reverse mask and extra etching steps. The dishing effect is also largely eliminated by the new process. The initial steps are largely the same, as depicted in FIGS. 1 through 4. The slight differences are shown in FIG. 9, there is a semiconductor substrate (101'), an oxide layer between 100 Å–400 Å thick (102'), and a nitride layer (103'). However, the Applicant's invention does not require as thick a nitride layer as required in the prior art. The nitride layer deposited need only be 500–1,700 Å thick, with a preferred thickness about 600 Å thick. This is the nitride base layer (103').

Figure 10:
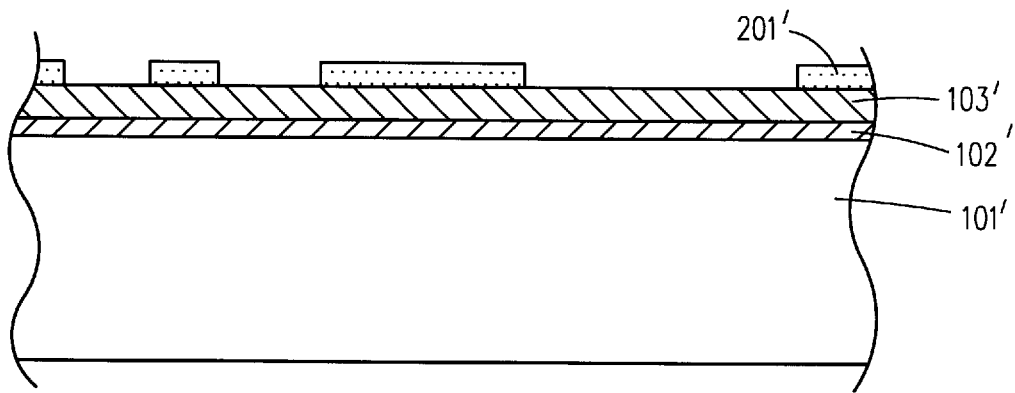
FIG. 10. Wafer profile as depicted after mask and etch through oxide and nitride base layers down to semiconductor substrate surface.
Figure 11:
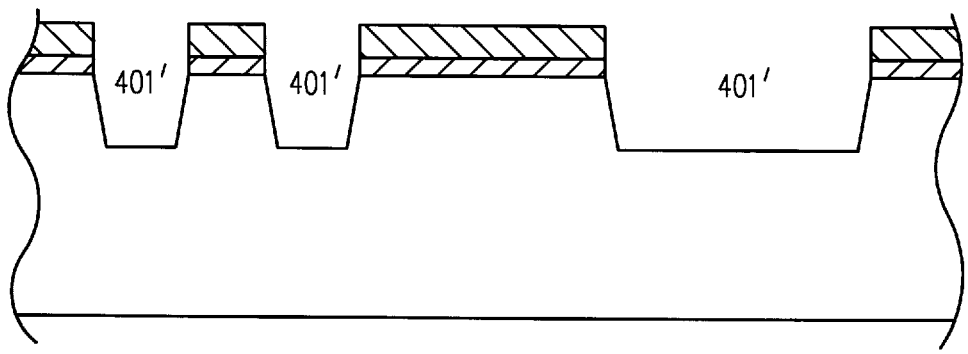
FIG. 11. Second etch into semiconductor substrate creating isolation trenches.

The wafer is then masked with a photoresist (201') and etched down to the semiconductor substrate surface, as shown in FIG. 10. A second etching step removes the exposed areas of the semiconductor substrate creating trenches (401'), the photoresist is then removed leaving the profile depicted in FIG. 11. These trenches can be any dimensions, but generally vary in depth from 0.1 to 1.0 μm and in width from about 0.1 to 1.0 μm.

Figure 1:
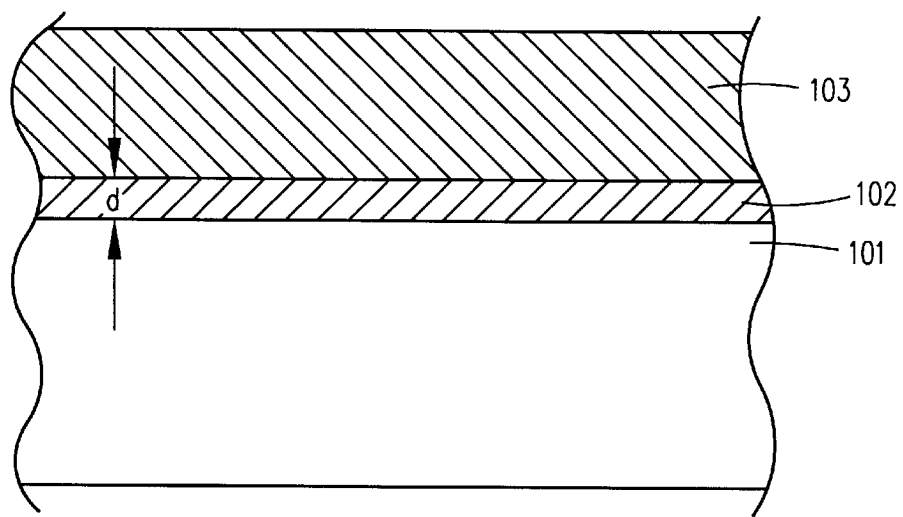
FIG. 1. Depicts a cross section of a semiconductor substrate with an oxide layer and a nitride base layer in preparation for fabrication by the methods of the present invention.
Figure 2:
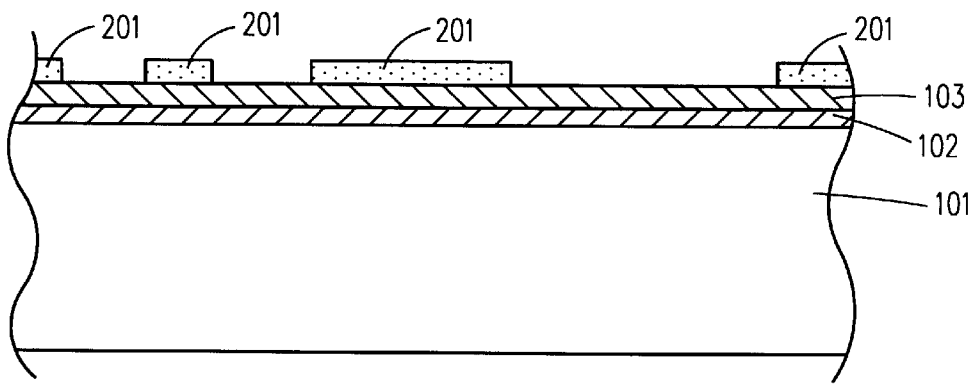
FIG. 2. The semiconductor substrate of FIG. 1 after pattern masking.
Figure 3:
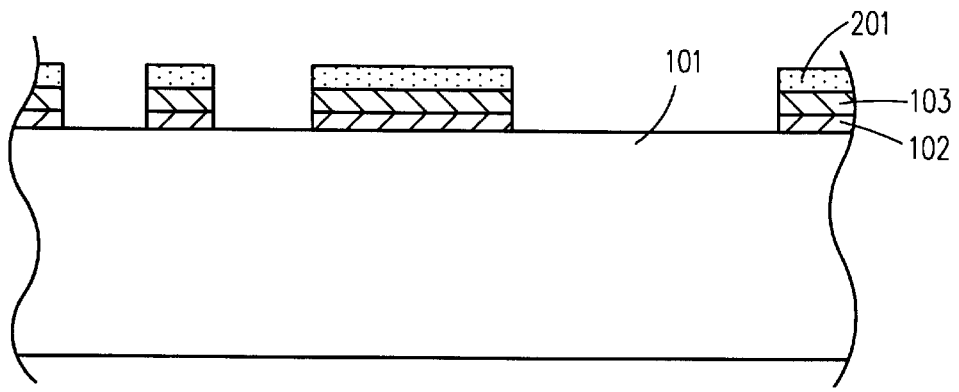
FIG. 3. First etch through oxide and nitride base layers down to semiconductor substrate surface.
Figure 4:
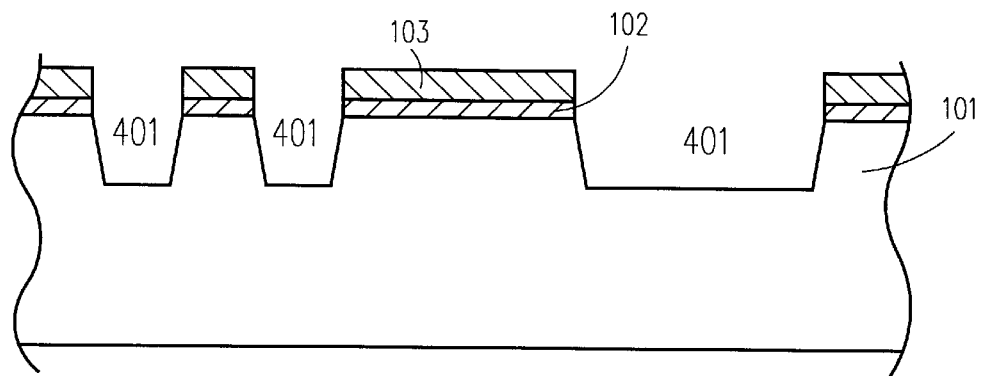
FIG. 4. Second etch into substrate body forming trenches.
Figure 5:
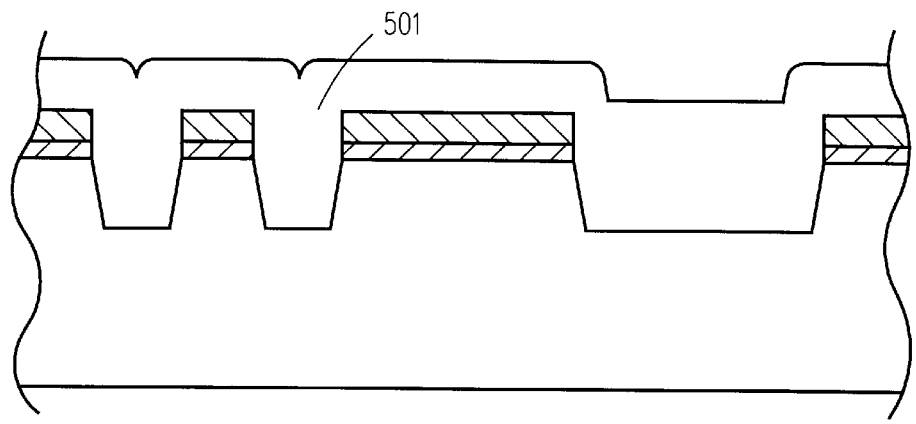
FIG. 5. Deposition of the electrically isolating material.
Figure 6:
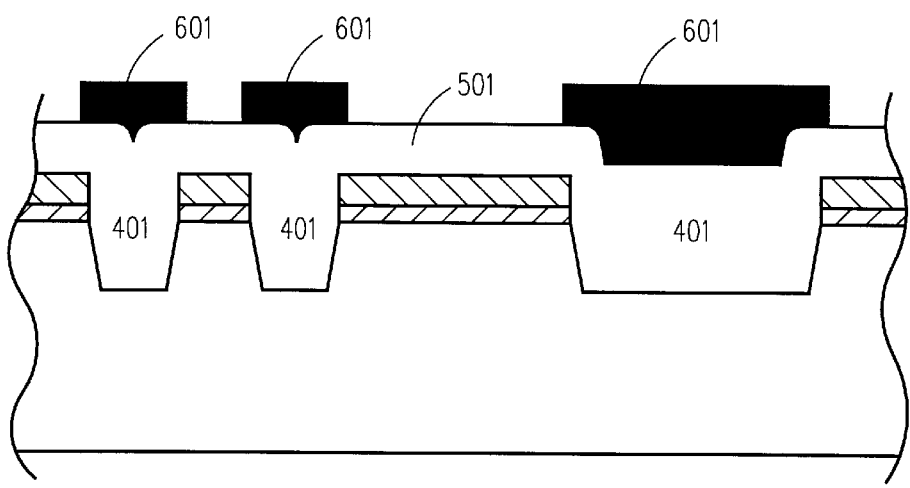
FIG. 6. Reverse mask as applied over the electrically isolating material of FIG. 5.
Figure 7:
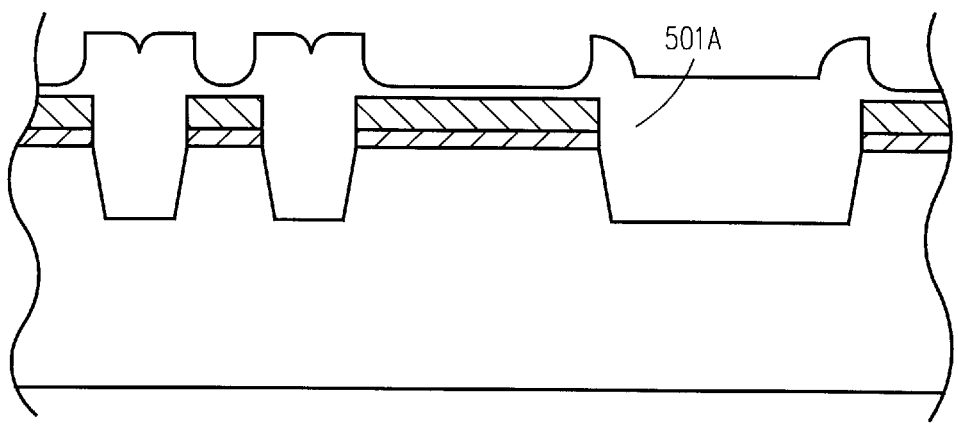
FIG. 7. Profile after third etching step removes excess electrically isolating material making CMP easier.
Figure 8:
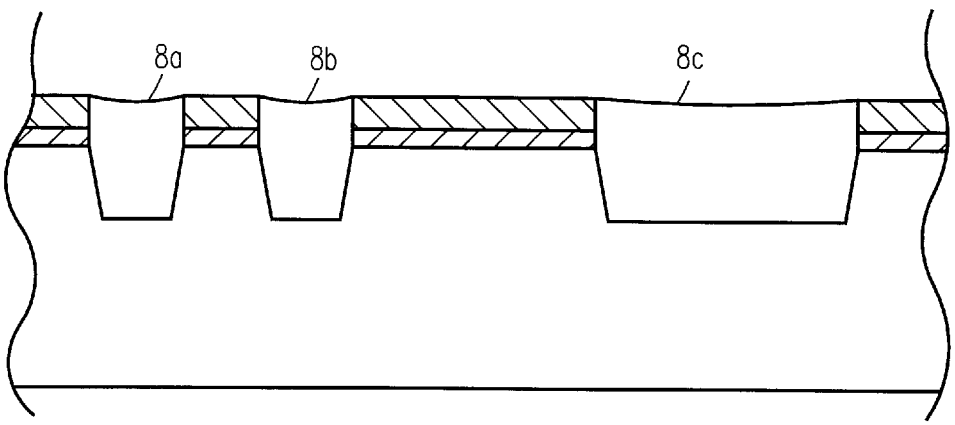
FIG. 8. Depicts the wafer profile after CMP polishes surface down to the nitride base layer.
Figure 12:
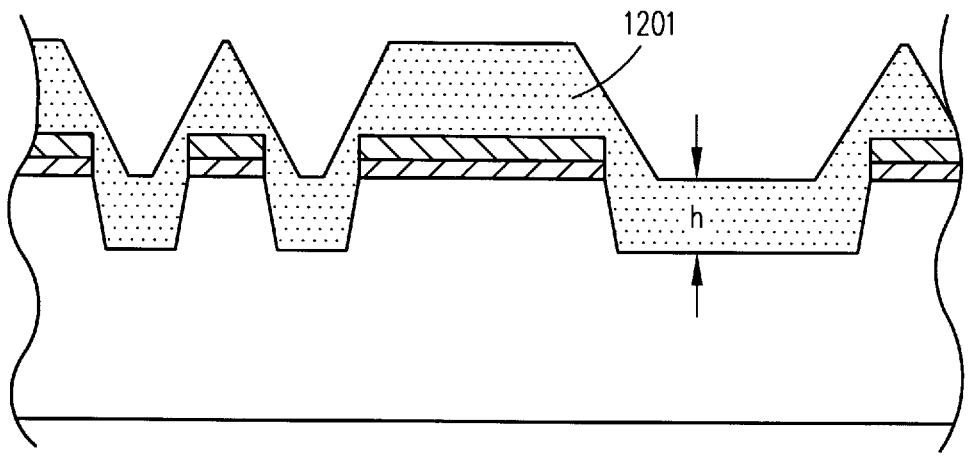
FIG. 12. Wafer surface after high density plasma ("HDP") oxide deposition over surface.

FIG. 12 shows the creation of a silicon dioxide layer (1201) over the existing wafer surface. This layer is created by using high density plasma oxide deposition ("HDP oxide deposition") to deposit silicon dioxide. This technology effectively alternates sputtering with chemical vapor deposition ("CVD") to create the unique oxide deposition profile shown in FIG. 12. FIG. 12 shows the characteristic angular deposition patterns of the HDP oxide deposition process. Note, that the trenches are filled with oxide, leaving the trench oxide level ("h") approximately the same height as that of the top of the trench walls ("h"). The advantage of this technique is that it takes less time and effort to grind down the angular profiles by CMP than it does with other deposition profiles, such as those depicted in FIG. 7.

Figure 13:
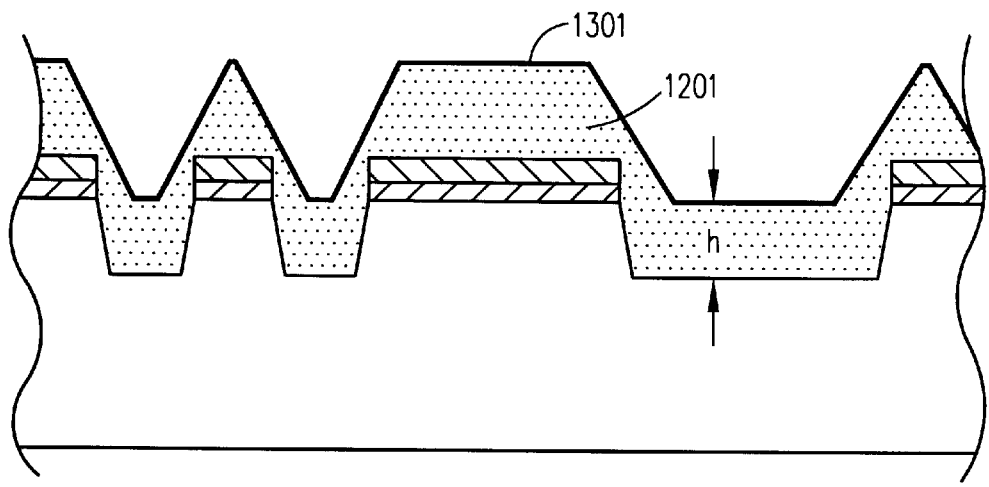
FIG. 13. Depiction of profile after a surface nitride is applied over HDP oxide layer.
Figure 14:
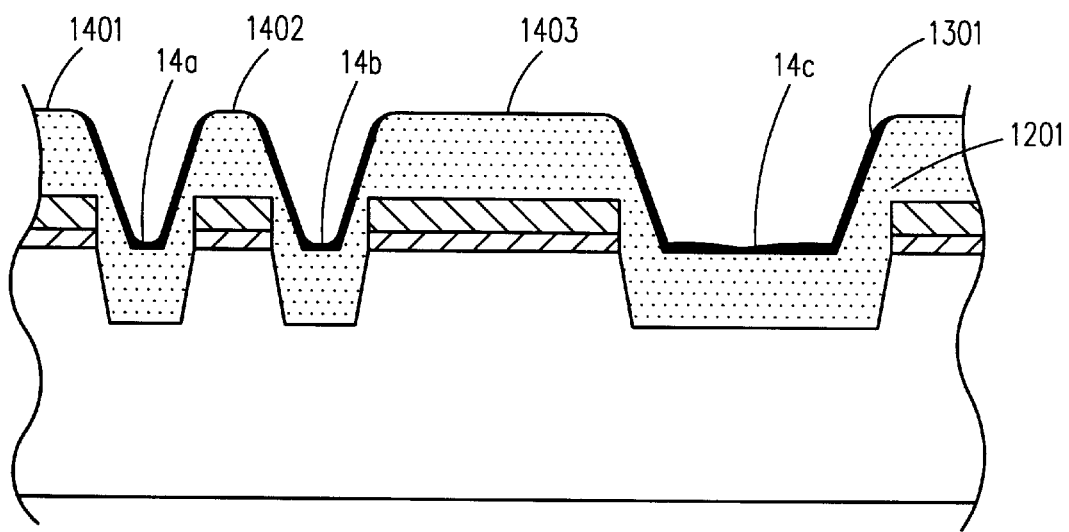
FIG. 14. Wafer surface after CMP with first slurry, optimized for nitride removal. Also shown is the removal of some electrically isolating material at the HDP oxide peaks.
Figure 15:
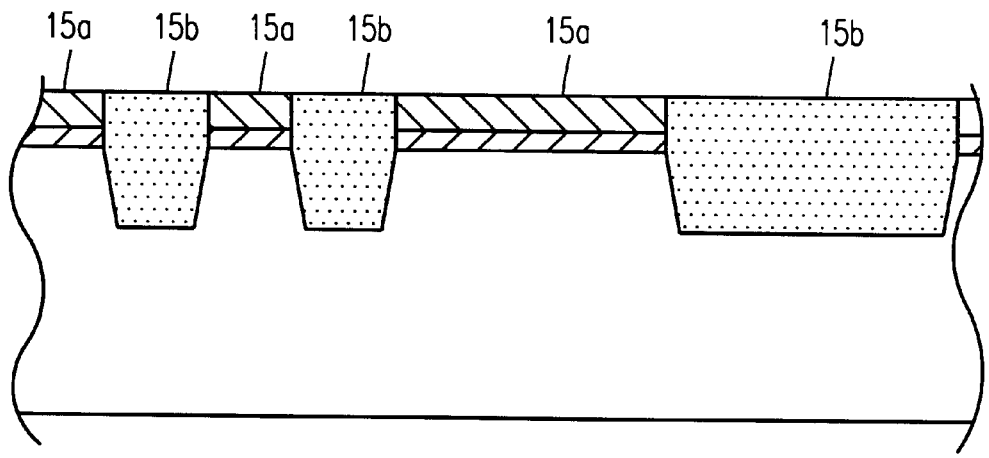
FIG. 15. Depicts the effects of CMP in second slurry optimized to remove the electrically isolating material. Also shown is the effect of continued CMP into nitride base layer.
Figure 16:
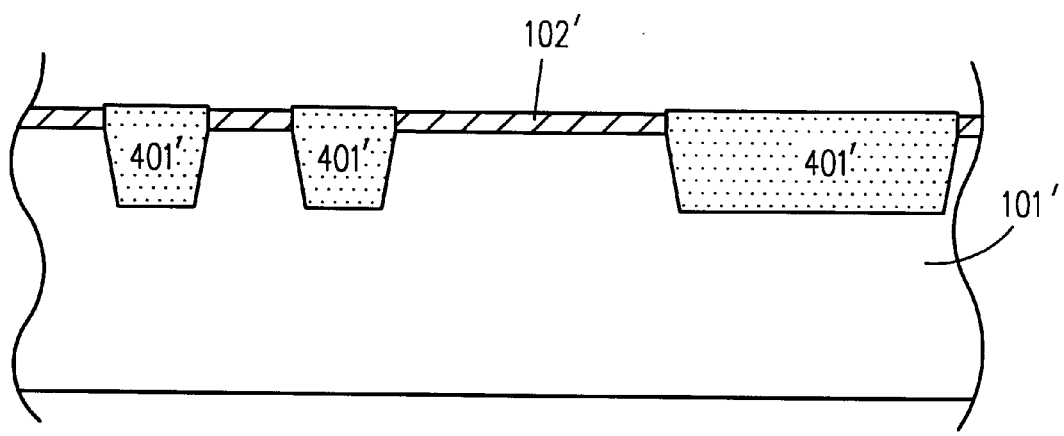
FIG. 16. Depicts the final etch, leaving planar surface and isolation trenches.

Following HDP oxide deposition (1201), the surface is then nitridized with a thin coat of $Si_3N_4$. This shield layer can be any thickness, but is usually between 150 Å to 400 Å, forming a nitride shield layer (1301) as shown in FIG. 13. This is followed by CMP using a first slurry. This first slurry has been optimized for nitride removal. Polishing is typically accomplished with commercially available pads (e.g. IC1000/Suba IV from Rodel, Inc.) and slurries (e.g. those produced by Rodel, Inc. or Cabot, Inc.). This leads to a nitride removal rate on the order of 50 Å–600 Å per minute. The wafer is ground and polished in the first slurry, until the peak layers of shield nitride are removed and some oxide is removed in the peak regions (1401, 1402, 1403), as shown in FIG. 14. Note: Due to the slight flexibility in the polyurethane CMP pad, some grinding takes place on the nitride shield layer located in the troughs (14a, 14b, 14c), shown in FIG. 14. The effect is more marked in wider (typically wider than 5 μm) trenches (14c). CMP is conducted so these trough nitride layers (14a, 14b, 14c) are largely undamaged. The end result is that the nitride is completely removed from the peak regions (1401, 1402, 1403) while the nitride is relatively untouched in the troughs (14a, 14b, 14c) as shown in FIG. 14. After CMP with the first slurry, a second CMP is done with a second slurry. Typically the same type of pads are used. The second slurry is optimized to remove the HDP oxide deposited silicon dioxide layer (1201). (Oxide removal rates on the order of 1500–3000 Å per minute are typical.) Due to the high selectivity of the second slurry, the second slurry is not very effective at removing the nitride shield layers in the troughs (14a, 14b, 14c). The result is that the peaks (1401, 1402, 1403), which have already had their nitride shield layers removed revealing the oxide below, are more vulnerable and easily removed by CMP using the second slurry, while the troughs, with their protective nitride shield layer, are relatively unaffected by the second slurry. The second slurry preferentially removes the oxide at anywhere from 5–30 times the nitride removal rate. The resulting beneficial effect is that while the silicon dioxide is ground down in all the peak regions (1401, 1402, 1403), the nitride shield layer protects the troughs (14a, 14b, 14c), preventing the phenomenon of dishing from occurring. CMP is continued until the process has ground down into the nitride base (15a) and shield (15b) layers, as shown in FIG. 15. These nitride layers are then etched away, leaving the isolation trenches (401') and a silicon dioxide layer (102') over a semiconductor substrate (101'), as shown in FIG. 16. The result is a highly planar surface with no dishing in the trenches, accomplished in less time and in fewer steps than the prior art.

The present invention has been particularly shown and described with respect to a certain preferred embodiment. However, it is readily apparent to those of ordinary skill in the art that various changes and modifications in form, semiconductor material, dielectric material, isolation material, oxide material, material conductivity, i.e. N-type or P-type, and detail may be made without departing from the spirit and scope of the invention. The inventions disclosed herein may be practiced without any element which is not specifically disclosed herein.

What is claimed is:

1. A process for fabricating highly planarizing integrated circuit structures comprising the following steps:
   a) providing a semiconductor substrate;
   b) fabricating a plurality of conformal dielectric layers on said semiconductor substrate;
   c) forming trenches through said plurality of conformal dielectric layers and into said semiconductor substrate;
   d) forming an electrically isolating material region over said plurality of dielectric layers and which fills said trenches, said electrically isolating material region formed by high density plasma oxide deposition;
   e) fabricating a nitride shielding layer over said electrically isolating oxide material region;
   f) chemical mechanical polishing said nitride shielding layer with a first slurry optimized for nitride removal, said chemical mechanical polishing continuing until some of said nitride shielding layer is removed exposing some of said electrically isolating oxide material region;
   g) chemical mechanical polishing of said exposed electrically isolating oxide material region and said nitride shielding layer with a second slurry optimized for removing said electrically isolating oxide material, continuing until said plurality of dielectric layers are exposed; and
   h) etching away the top dielectric layer leaving said trenches filled with said electrically isolating oxide material forming electrical isolation regions in said trenches.

2. A process as in claim 1 wherein said semiconducting substrate is silicon or gallium arsenide.

3. A process as in claim 1, wherein said plurality of dielectric layers further comprises a first conformal layer of silicon dioxide and a second conformal layer of nitride, said conformal nitride layer comprising a base layer.

4. A process as in claim 1, wherein said electrically isolating material region is comprised of silicon dioxide.

5. A process as in claim 3, wherein said chemical mechanical polishing with said second slurry continues until said base nitride layer is exposed.

6. A process for fabricating highly planarizing integrated circuit structures comprising the following steps:

a) providing a semiconductor substrate;

b) forming a first conformal layer on said semiconductor substrate, said first conformal layer comprising silicon dioxide;

c) forming a second conformal nitride base layer on said silicon dioxide layer;

d) forming trenches through said silicon dioxide and nitride base layers into said semiconductor substrate;

e) using high density plasma oxide deposition to form an electrically isolating oxide region over said nitride base layer and to fill said trenches;

f) forming a conformal nitride shielding layer over said electrically isolating oxide region;

g) a first chemical mechanical polishing step using a first slurry optimized to remove nitride, said first chemical mechanical polishing continuing until some of said conformal nitride shielding layer is removed, exposing some of said electrically isolating oxide region;

h) a second chemical mechanical polishing step using a second slurry optimized to remove said electrically isolating oxide, said second chemical mechanical polishing continuing until said polishing exposes said nitride base layer; and i) etching away remaining portions of said nitride base layer leaving trenches filled with electrically isolating oxide material to form electrical isolation regions in said trenches.

7. A process as in claim 6 wherein said semiconductor substrate is silicon or gallium arsenide.

8. A process as in claim 6 wherein said first conformal silicon dioxide layer is between about 100 Å and about 400 Å thick.

9. A process as in claim 6 wherein said second conformal nitride base layer is between about 500 Å and about 1,700 Å thick.

10. A process as in claim 6 wherein said trenches are between 0.1 microns and 10 microns wide and between about 0.2 microns and about 0.5 microns deep.

11. A process as in claim 6 wherein said electrically isolating oxide region comprised of silicon dioxide.

12. A process as in claim 6 wherein said conformal nitride shielding layer is between about 150 Å and about 400 Å thick.

13. A process for fabricating highly planar integrated circuit structures on a semiconductor substrate with a first conformal silicon dioxide layer and a second conformal nitride base layer with trenches extending downward through said silicon dioxide and nitride base layers into said semiconductor substrate, comprising the following steps:

a) forming an electrically isolating oxide region having an angular profile using high density plasma oxidation, said electrically isolating oxide region covering said conformal nitride base layer and said trenches;

b) forming a nitride shielding layer over said electrically isolating oxidized region;

c) a first chemical mechanical polishing step using a first slurry optimized for removing nitride, said chemical mechanical polishing continuing until some of said nitride shielding layer is removed, exposing some of said electrically isolating oxide region;

d) a second chemical mechanical polishing step using a second slurry optimized to remove said electrically isolating oxide, said chemical mechanical polishing step continuing until polishing exposes said conformal nitride base layer; and e) etching away remaining portions of said conformal nitride base layer leaving trenches filled with electrically isolating oxide material to form isolation regions in said trenches.

14. A process as in claim 13 wherein said electrically isolating oxide region having an angular profile has peak and trough areas with said trough regions extending down into said trenches and said peak regions extending above non-trench areas of said semiconducting substrate.

15. A process as in claim 14 wherein said electrically isolating oxide is between about 0.1 microns and about 0.5 microns thick in said trough area.

16. A process as in claim 14 wherein said first chemical mechanical polishing step removes some of said nitride shielding layer in said peak area exposing some of said electrically isolating oxide; and said second chemical mechanical polishing step continued until polishing exposes said conformal nitride base layer in said peak area.

* * * * *